(12) United States Patent  (10) Patent No.: US 6,469,584 B1
Eker et al.  (45) Date of Patent: Oct. 22, 2002

(54) PHASE-LOCKED LOOP SYSTEM AND METHOD USING AN AUTO-RANGING, FREQUENCY SWEEP WINDOW VOLTAGE CONTROLLED OSCILLATOR

(75) Inventors: Mehmet M. Eker, Santee, CA (US); Joseph J. Balardeta, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/708,819

(22) Filed: Nov. 8, 2000

(51) Int. Cl.⁷ .................................................. H03L 7/00
(52) U.S. Cl. ........................... 331/11; 331/4; 331/34; 331/1 R; 331/DIG. 2; 331/1 A
(58) Field of Search .................... 331/4, 34, 1 R, 331/DIG. 2, 1 A

(56) References Cited

U.S. PATENT DOCUMENTS

| | | |
|---|---|---|
| 5,272,453 A | 12/1993 | Traynor et al. |
| 5,382,922 A | 1/1995 | Gersbach et al. |
| 5,446,417 A | 8/1995 | Korhonen et al. |
| 5,477,198 A | 12/1995 | Anderson et al. |
| 5,629,652 A | 5/1997 | Weiss |
| 5,757,240 A * | 5/1998 | Boerstler et al. ............. 331/34 |
| 5,894,246 A | 4/1999 | Barnett et al. |
| 5,903,195 A * | 5/1999 | Lukes et al. ................... 331/4 |
| 5,952,892 A | 9/1999 | Szajda |
| 5,955,928 A | 9/1999 | Smith |

* cited by examiner

Primary Examiner—Arnold Kinkead
(74) Attorney, Agent, or Firm—Gray Cary Ware & Freidenrich

(57) ABSTRACT

A system and method have been provided for a phase-locked loop (PLL) circuit to use a selectable VCO frequency range during the acquisition of a signal, with a larger VCO frequency sweep window once the signal is being tracked. The circuit uses a frequency detector during acquisition, and the VCO is limited to operation is a plurality of discrete frequency bands. Each frequency band is sequentially searched using the low VCO gain. Upon acquisition, the frequency band is locked in, a phase detector is utilized, and the VCO sweep window is increased for tracking purposes.

15 Claims, 3 Drawing Sheets

PHASE-LOCKED LOOP SYSTEM AND METHOD USING AN AUTO-RANGING, FREQUENCY SWEEP WINDOW VOLTAGE CONTROLLED OSCILLATOR

BACKGROUND OF THE INVENTION

1. Field of the Invention

This invention relates generally to phase-locked loops and, more particularly, to a system and method for acquiring and tracking a data signal with a voltage controlled oscillator (VCO) having selectable frequency ranges and a selectable frequency sweep window.

2. Description of the Related Art

Phase-locked loops (PLLs) and clock recovery circuits (CRCs) find wide application in areas such as communications, wireless systems, digital circuits, and disk drive electronics (parts of the following background are excerpts from Behzad Ravavi, "Design of Monolithic Phase-Locked Loops and Clock Recovery Circuits—A Tutorial"). While the concept of phase locking has been in use for more than half a century, monolithic implementation of PLLs and CRCs has become possible only in the last twenty years, and popular in the last ten years. Two factors account for this trend: the demand for higher performance and lower cost in electronic systems, and the advance of integrated-circuit (IC) technologies in terms of speed and complexity.

In many systems, data is transmitted or retrieved without any additional timing reference. In optical communications, for example, a stream of data flows over a single fiber with no accompanying clock, but the receiver must eventually process the data synchronously. Thus, the timing information (e.g., the clock) must be recovered from the data at the receive end. Most clock recovery circuits employ phase locking.

An ideal voltage-controlled oscillator (VCO) generates a periodic output whose frequency is a linear function of a control voltage $v_{cont}$:

$$\omega_{out} = w_{FR} + K_{VCO} V_{cont}$$

where $\omega_{FR}$ is the "free-running" frequency and $K_{VCO}$ is the "gain" of the VCO (specified in rad/s/V). Since phase is the time integral of frequency, the output of a sinusoidal VCO can be expressed as:

$$y(t) = A \cos(\omega_{FR} t + K_{VCO} \int_{-\infty}^{t} V_{cont} dt).$$

In practical VCOs, $K_{VCO}$ exhibits some dependence on the control voltage and eventually drops to zero as $|V_{cont}|$ increases.

A VCO is considered to be a linear time-invariant system, with the control voltage as the system's input and the excess phase of the output signal as the system's output. Since the excess phase is:

$$\phi_{out}(t) = K_{VCO} \int V_{cont} dt,$$

the input/output transfer function is:

$$\frac{\Phi_{out}(s)}{V_{cont}(s)} = \frac{K_{VCO}}{s}.$$

The above equation reveals an interesting property of VCOs: to change the output phase, we must first change the frequency and let the integration take place. For example, suppose for $t < t_0$, a VCO oscillates at the same frequency as a reference, but with a finite phase error. To reduce the error, the control voltage, $V_{cont}$, is stepped by $+\Delta V$ at $t = t_0$, thereby increasing the VCO frequency and allowing the output to accumulate phase faster than the reference. At $t = t_1$, when the phase error has decreased to zero, $V_{cont}$ returns to its initial value. Now, the two signals have equal frequencies and zero phase difference. Note also that the same goal can be accomplished by lowering the VCO frequency during this interval.

An ideal phase detector (PD) produces an output signal whose dc value is linearly proportional to the difference between the phases of two periodic inputs:

$$\overline{V_{out}} = K_{PD} \Delta \phi$$

where $K_{PD}$ is the "gain" of the phase detector (specified in V/rad), and $\Delta \phi$ is the input phase difference. In practice, the characteristic may not be linear or even monotonic for large $\Delta \phi$. Furthermore, $K_{PD}$ may depend on the amplitude or duty cycle of the inputs.

A phase-locked loop is a feedback system that operates on the excess phase of nominally periodic signals. This is in contrast to familiar feedback circuits where voltage and current amplitudes, and their rate of change are of interest. A simple PLL, consists of a phase detector, a low-pass filter (LPF), and a VCO. The PD serves as an "error amplifier" in the feedback loop, thereby minimizing the phase difference, $\Delta \phi$, between $x(t)$ and $y(t)$. The loop is considered "locked" if $\Delta \phi$ is constant with time, a result of which is that the input and output frequencies are equal.

In the locked condition, all the signals in the loop have reached a steady state and the PLL operates as follows. The phase detector produces an output whose dc value is proportional to $\Delta \phi$. The low-pass filter suppresses high-frequency components in the PD output, allowing the value to control the VCO frequency. The VCO then oscillates at a frequency equal to the input frequency and with a phase difference equal to $\Delta \phi$. Thus, the LPF generates the proper control voltage for the VCO.

It is important to note that in the above example the loop locks only after two conditions are satisfied: 1) $\omega_{out}$ has become equal to $\omega_{in}$; and, 2) the difference between $\phi_{in}$ and $\phi_{out}$ has settled to its proper value. If the two frequencies become equal at a point in time but $\Delta \phi$ does not establish the required control voltage for the VCO, the loop must continue the transient, temporarily making the frequencies unequal again. In other words, both "frequency acquisition" and "phase acquisition", or "tracking", must be completed. This is, of course, to be expected because for lock to occur again, all the initial conditions of the system, including the VCO output phase, must be updated.

Acquisition range is a critical parameter because 1) it trades directly with the loop bandwidth, and therefore, VCO gain. For example, if an application requires a small loop bandwidth, the acquisition range will be proportionally small; 2) it determines the maximum frequency variation in the input or the VCO that can be accommodated. In monolithic implementations, the VCO free-running frequency can vary substantially with temperature and process, thereby requiring a wide acquisition range even if the input frequency is tightly controlled.

FIG. 1 is a schematic block diagram of a PLL with aided frequency acquisition (prior art). Here, the system utilizes a frequency detector (FD) and a second low-pass filter, $LPF_2$, whose output is added to that of $LPF_1$. The FD produces an output having a dc value proportional to, and with the same polarity as $\omega_{in} - \omega_{out}$. If the difference between $\omega_{in}$ and $\omega_{out}$ is large, the PD output has a negligible dc component and the VCO is driven by the dc output of the FD with negative feedback, thereby moving $\omega_{out}$ toward $\omega_{in}$. As $|\omega_{in}-\omega_{out}|$ drops, the dc output of the FD decreases, whereas that of the PD increases. Thus, the frequency detection loop gradually relinquishes the acquisition to the phase-locked loop, becoming inactive when $\omega_{in}-\omega_{out}=0$.

It is important to note that in a frequency detection loop, the loop gain is relatively constant, independent of $|\omega_{in}-\omega_{out}|$, whereas in a simple phase-locked loop, it drops if $|\omega_{in}-\omega_{out}|$ exceeds $\omega_{LPF}$. For this reason, aided acquisition using FDs can substantially increase the capture range.

For a VCO in a PLL, the following parameters are important. 1) Tuning range: i.e., the range between the minimum and maximum values of the VCO frequency. In this range, the variation of the output amplitude and jitter must be minimal. The tuning range must accommodate the PLL input frequency range as well as process- and temperature-induced variations in the VCO frequency range. The tuning range is typically at least $\pm 20\% w_{FR}$. 2) Jitter and phase noise: timing accuracy and spectral purity requirements in PLL applications impose an upper bound on the VCO jitter and phase noise. 3) Supply and substrate noise rejection: if integrated along with digital circuits, VCOs must be highly immune to supply and substrate noise. When used, a frequency divider can corrupt the VCO output by injecting noise into the common substrate. Such effects become more prominent if a PLL shares the same substrate and package with a large digital processor.

Low VCO gain is a desirable feature as it reduces the circuit noise effects at the VCO output. Therefore, a less jittery, more stable VCO output is possible even on very high gate count mixed signal chips (with lots of power supply noise). However, in today's high performance, low power mixed signal designs, low gain and low power fight against each other. These chips operate at low power because their supply voltages are down to 1.8 Volts or even lower, not necessarily because they draw less current from the power supply. Even though the low power supply voltage does not limit the oscillation frequency of a VCO, it puts a limit on the control voltage range in which VCO frequency is swept linearly. If the maximum and minimum oscillation frequencies obtain from the VCO are labeled $F_{max}$ and $F_{min}$, respectively, and the control voltage range in which the VCO can be swept linearly $\Delta V$, the VCO gain is given as below:

$$VCO\_Gain = \frac{F_{max} - F_{min}}{\Delta V}$$

Therefore, as $\Delta V$ gets smaller with low supply voltage values, the VCO gain becomes larger. To make the matters even worse, the process and temperature variations in CMOS circuits mandate that $F_{max}$ and $F_{min}$ be farther apart from each other to ensure the coverage of the actual operating frequency of interest under any condition, and thus causing even higher VCO gain.

It would be advantageous if a PLL with aided frequency acquisition circuit could be designed with a low noise output signal.

It would be advantageous if a PLL with an aided frequency acquisition circuit could be designed to have a minimal VCO frequency range during acquisition, but a larger frequency range during tracking.

It would be advantageous if the above-mentioned PLL with aided frequency acquisition circuit could be designed so that the acquisition occurred through the successive analysis of distinct frequency bands, so that the VCO gain could be minimized.

It would be advantageous if a PLL circuit could be designed to automatically select the frequency band of interest and the type of detector used in the acquisition and tracking of a data signal.

SUMMARY OF THE INVENTION

Accordingly, a method for acquiring and tracking a signal with a selectable frequency range VCO is provided. The method comprises: accepting a data signal having a first frequency; accepting a reference signal having approximately the first frequency; selecting a VCO range from a plurality of frequency ranges; acquiring the reference signal in response to selecting the VCO frequency range; and, increasing the frequency sweep to track the data signal.

In acquisition, the VCO signal is compared to the reference signal to detect frequency differences. In tracking, the VCO signal is compared to the data signal to detect phase differences. In response to detection, the VCO is supplied with a control voltage.

Following acquisition, the method comprises: sensing that the reference signal has been acquired; widening the frequency sweep window; and, switching from frequency detecting the reference signal to phase detecting the data signal, in response to sensing that the reference signal has been acquired.

If tracking is lost, the method comprises: switching from phase detecting the data signal to frequency detector the reference signal; while maintaining the larger frequency sweep window. Once reacquired, the method comprises: switching from frequency detecting the reference signal to phase detecting the data signal.

An auto-ranging phase-locked loop system for acquiring and tracking a data signal is also provided including a voltage controlled oscillator accepting frequency range commands, sweep window commands, and a control voltage. The VCO supplies a VCO signal having a frequency responsive to the control voltage and a frequency range responsive to the frequency range and sweep window commands. The PLL circuit also includes a frequency detector, phase detector, lock-detect circuit, and range circuit, as explained in more detail below.

DETAILED DESCRIPTION OF THE PREFERRED EMBODIMENTS

Figure 1:
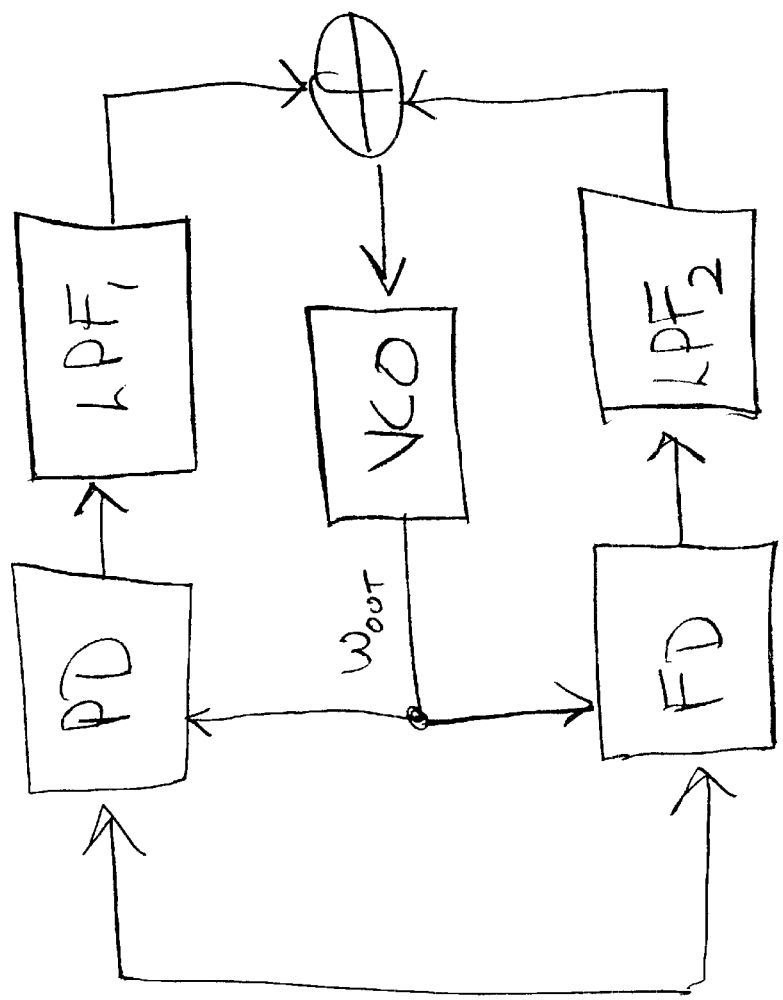
FIG. 1 is a schematic block diagram of a PLL with aided frequency acquisition (prior art).
Figure 2:
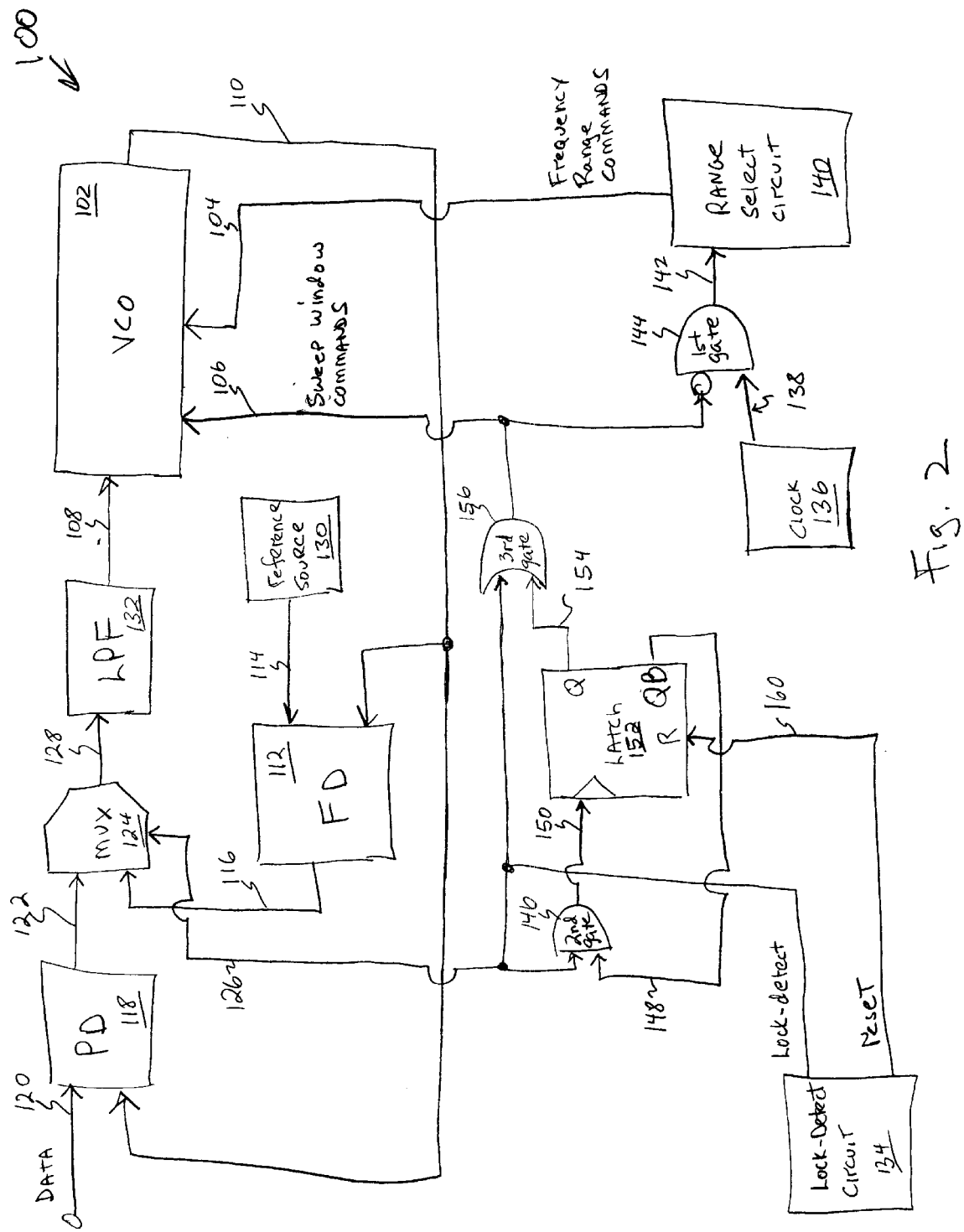
FIG. 2 is a schematic block diagram illustrating the present invention auto-ranging phase-locked loop system for acquiring and tracking an input signal.

FIG. 2 is a schematic block diagram illustrating the present invention auto-ranging phase-locked loop system 100 for acquiring and tracking an input signal. A voltage controlled oscillator 102 has a first input on line 104 to accept frequency range commands, a second input on line 106 to accept sweep window commands, and a third input on line 108 to accept a control voltage. The VCO 102 has an output on line 110 to supply a VCO signal having a frequency responsive to the control voltage and a frequency range responsive to the frequency range and sweep window commands.

A frequency detector 112 has a first input on line 110 connected to the VCO output to accept the VCO signal, a second input on line 114 to accept a reference signal at a first frequency, and an output on line 116 to supply a control voltage, in response to comparing the frequencies of the input signals.

A phase detector 118 has a first input on line 110 connected to the VCO output to accept the VCO signal, a second input on line 120 to accept a data signal, at approximately the first frequency, and an output on line 122 to supply a control voltage in response to comparing the frequencies of the input signals.

A multiplexor (MUX) 124 has a first input on line 116 connected to the output of the frequency detector 112, a second input on line 122 connected to the output of the phase detector 118, a control input on line 126 to accept a lock-detect signal, and an output on line 128 to supply the selected input in response to the lock-detect signal.

A reference source 130 has an output on line 114 connected to the second input of frequency detector 112 to supply the reference signal. A low-pass filter 132 has an input on line 128 connected to the MUX output and an output on line 108 connected to the third input of the VCO 102.

A lock-detect circuit 134 has a first output on line 126 to supply a lock-detect signal when the reference signal has been acquired by the PLL system 100. The MUX 124 switches the MUX output from the frequency detector output on line 116 to the phase detector output on line 122, in response to the lock-detect signal on line 126. Likewise, the VCO 102 accepts a sweep window command on line 106, to switch from a small to a large window, in response to the lock-detect signal on line 126. As explained in more detail below, the large sweep window command remains set until the system 100 is reinitialized.

A clock 136 has an output on line 138 to supply a clock signal having a period. A range select circuit 140 has an input on line 142 responsive to a clock signal on line 138 and an output on line 104 to supply a first frequency range command during a first clock period, a second frequency range command during a second clock period, and a third frequency range command during a third clock period. The VCO 102 supplies a VCO signal on line 110 in the first frequency range during the first period, in a second frequency range during the second period, and in a third frequency range during the third period. Although an example of three range commands, with three frequency ranges, has been given above, the present invention is not limited to any particular number of ranges.

A first logic gate 144 has a first input on line 106 responsive to the lock-detect signal on line 126, and second input connected to the output of the clock circuit 136 on line 138. The first logic gate has an output on line 142 connected to the range select circuit 140. The range select circuit 140 receives clock signals on line 142 in response to the lock-detect signal on line 126. Although an AND gate with one inverted input is shown, the present invention is not limited by any particular logic structure, and many other arrangements of gates are possible to accomplish the same task.

A second logic gate 146 has a first input connected to the lock-detect circuit output on line 126 to accept the lock-detect signal, a second input on line 148, and an output on line 150. A latch 152 has a data input connected to the output of the second logic gate 146 on line 150, a first output on line 154 to supply a latched detect signal, and a second output connected to the second input of the second logic gate 146 on line 148 to supply the complement of the latched detect signal.

A third logic gate 156 has a first input on line 126 connected to the output of the lock-detect circuit 134 to accept the lock-detect signal, a second input on line 154 connected to the first output of the latch 152 to accept the latch detect signal, and an output on line 106 connected to the sweep window control input of the VCO 102 and the first input of the first logic gate 144 to supply the sweep window command.

As depicted, the second logic gate 146 is an AND gate and the third logic gate 156 is an OR gate. It should be understood that the functions performed by these gates can be performed by equivalent logic structures without affecting the performance of the system 100. Latch 152 can be enabled with a D flip-flop. However, an equivalent latch could be made through a variety of other types of logic structures.

An example follows using specific signal states to illustrate the operation of the invention. Note that although the signals are identified as having either "high" or "low" states, the invention is not dependent to any particular set of signal states, and equivalent circuitry can be enabled using different signal values to operate the PLL.

The lock-detect circuit 134 first output on line 126 supplies an initial "high" lock-detect signal. The second logic gate 146 supplies a "high" signal on line 150 in response to an initial "high" lock-detect signal on line 126. The latch 152 first output on line 154 supplies a "high" latched detect signal in response to the initial lock-detect signal, that remains "high" regardless of subsequent "high" signals from the first output of the lock-detect circuit 134. The third logic gate 156 supplies a "high" signal on line 106 which is the large sweep window command. The large sweep window command is supplied to the VCO 102 and the first gate 144. The VCO 102 switches to the large VCO sweep window in response to the "high" sweep window command signal, and the first logic gate 144 blocks the clock signal on line 138 in response to the "high" (large) sweep window command signal. Further, the MUX 124 switches from phase detector output to frequency detector output in response to a "high" lock-detect signal.

In the event that the data signal is no longer phase-locked, the lock-detect circuit 134 first output supplies a "low" lock-detect signal on line 126. Then, the MUX 124 switches to the frequency detector output on line 116. The VCO sweep window and frequency range selection remain fixed.

When the reference signal is reacquired by the frequency detector 112, a second (or any subsequent) "high" lock-detect signal, is presented on line 126. The second logic gate 140 supplies a "low" signal in response to the second "high" lock-detect signal. The latch 152 first output supplies a "high" latched detect signal in response to the second lock-detect signal. The third logic gate 156 supplies a "high" signal, or a large sweep window command signal in response to every lock-detect signal. Alternately stated, the large sweep window command remains fixed despite the state of the lock-detect signal. The VCO frequency sweep window remains large and the first logic gate 144 continues to blocks the clock signal to the range select circuit 140. However, the MUX 124 selects the phase detector output on line 122 in response to the second "high" lock-detect signal.

In some aspects of the invention, the lock-detect circuit 134 has a second output to supply a "high" reset signal on line 160 and a "low" signal on the first output (line 126) when a decision has been made that the acquisition process must be reinitialized. The latch 152 has a reset input connected to the second output on line 160 to accept the reset signal. The latch 152 initializes the latch first output on line 154 to a "low" signal, in response to the "high" reset signal. Likewise, the latch second output on line 148 is set to "high" so that the next "high" lock detect signal will be passed to the latch 152. The third logic gate 156 supplies a "low" signal, which is the small sweep window command in response to a "high" rest signal on line 160. Therefore, the VCO frequency sweep window is set to small (narrow) in response to the small sweep window command signal, and the first logic gate 144 supplies the clock signal to the range circuit 142 in response to the small sweep window command signal. Further, the MLUX 124 selects the frequency detector output in response to the "low" lock-detect signal on line 126.

The auto-ranging VCO makes it possible to realize a small frequency range VCO without compromising the total frequency coverage. The range in which a VCO is designed to operate is very much process dependent. In some cases, due to process variations, a VCO can have a range that does not cover the actual operating frequency. With the present invention auto-ranging approach, the occurrences of such events can be reduced, if not eliminated, resulting in higher manufacturing yields.

To decrease the VCO frequency range, the separation between $F_{max}$ and $F_{min}$ must be decreased. To ensure the coverage of the actual operating frequency under any condition, with a limited frequency range VCO, the auto-ranging system was developed. In the auto-ranging system, $F_{max}$ and $F_{min}$ are set to give the desired low VCO gain. The process coverage is achieved by having the VCO centered at different frequencies and sweeping the VCO around that center frequency. Theoretically, there is no limit for the number of ranges. However, in practice, the number of ranges is somehow limited by the required acquisition time.

The circuit operates as follows: At the beginning of the acquisition process, it is most likely that the PLL 100 will be out of lock. Therefore, the lock-detect output on line 126 will be "low". This condition selects the Frequency Detector (FD) 112 at the input to MUX 124 on line 116, and small sweep window for the VCO 102. The sweep window command will be "low" and the third logic gate 156 will be open so that the range select circuit 140 is searching for a range. The range select circuit 140 outputs a change state every 1 ms, for example, but the invention is not limited to any particular value. This time is associated with the acquisition time of the loop in every range. Normally, this time is large enough to search each range thoroughly. Only a certain percentage of $\Delta V$, the VCO control voltage is used during the lock search. The control voltage range is responsive to the gain commands on line 106.

After the lock is achieved, $\Delta V$ is extended back to its full swing (large sweep window). This is necessary to ensure that only the range that has the operating frequency close to the middle of the frequency range will be selected. If, after the lock is achieved, the environmental conditions change (for example, the temperature changes), the operating frequency will still be covered (the free running frequency of a VCO moves up and down with temperature quite a bit in certain circuits).

Table 1 summarizes the PLL control states and their correspondence to some key signal states.

TABLE 1

Control States

| STATE | RE-SET | LOCK-detect | Q | Sweep Window command | Sweep Window | PD/FD | SEARCH |
|---|---|---|---|---|---|---|---|
| Unlock | 0 | 0 | 0 | 0 | small | FD | ON |
| First Lock | 0 | 1 | 1 | 1 | large | PD | OFF |
| Unlock | 0 | 0 | 1 | 1 | small | FD | OFF |
| Final Lock | 0 | 1 | 1 | 1 | large | PD | OFF |
| IF A LOSS OF LOCK OCCURS AFTER THIS STATE | | | | | | | |
| Unlock | 0 | 0 | 1 | 1 | large | FD | OFF |
| Final Lock | 0 | 1 | 1 | 1 | large | PD | OFF |
| ANOTHER SCENARIO (2) | | | | | | | |
| Unlock | 0 | 0 | 0 | 0 | small | FD | ON |
| Final Lock | 0 | 1 | 1 | 1 | large | PD | OFF |
| IF A LOSS OF LOCK OCCURS AFTER THIS STATE | | | | | | | |
| Unlock | 0 | 0 | 1 | 1 | large | FD | OFF |
| Final Lock | 0 | 1 | 1 | 1 | large | PD | OFF |
| IF A LOCK CANNOT BE ESTABLISHED FOR PREDIFINED TIME PERIOD | | | | | | | |
| Unlock | 0 | 0 | 1 | 1 | large | FD | OFF |
| Unlock | 1 | 0 | 0 | 0 | small | FD | ON |
| First Lock | 0 | 1 | 1 | 1 | large | PD | OFF |
| Unlock | 0 | 0 | 1 | 1 | large | FD | OFF |
| Final Lock | 0 | 1 | 1 | 1 | large | PD | OFF |

The range select circuit 140 keeps incrementing (searching), looking for a lock in every range for the duration of 1 ms, until a lock is achieved. When the lock is achieved, the lock-detect and sweep window command signal become "high". The third logic gate 156 is blocked and searching for a range stops. The loop switches to phase detector (PD) 118 and $\Delta V$, the VCO control voltage, is extended to its full swing (large sweep window). During this phase, the loop aligns the VCO signal to the data signal. If the PLL 100 falls out of lock due to a very large phase misalignment between the VCO 102 and the DATA signal, the lock-detect signal becomes "low" and the loop switches to frequency detector 112, but sweep window command does not change state. Therefore, the range select circuit 140 maintains its inactive status, as the range is assumed to be correct. The same frequency range is maintained and the frequency acquisition process starts. As the sweep window command is still "high", the large VCO frequency sweep window is selected. The frequency acquisition takes place under the unlimited, or large $\Delta V$ condition.

When the frequency lock is achieved, lock-detect signal will go "high" and the phase detector 118 is selected. The phase alignment process starts again. Notice that after the frequency lock is achieved for the first time, the first latch output (Q) goes "high" and (QB) goes "low". The "low" QB blocks the second logic gate 146 for subsequent lock-detect state changes. As a result, the range selection process is insensitive to the temporary out-of-lock situations. The complete states of PLL control I/O's are shown in Table 1, above.

Figure 3:
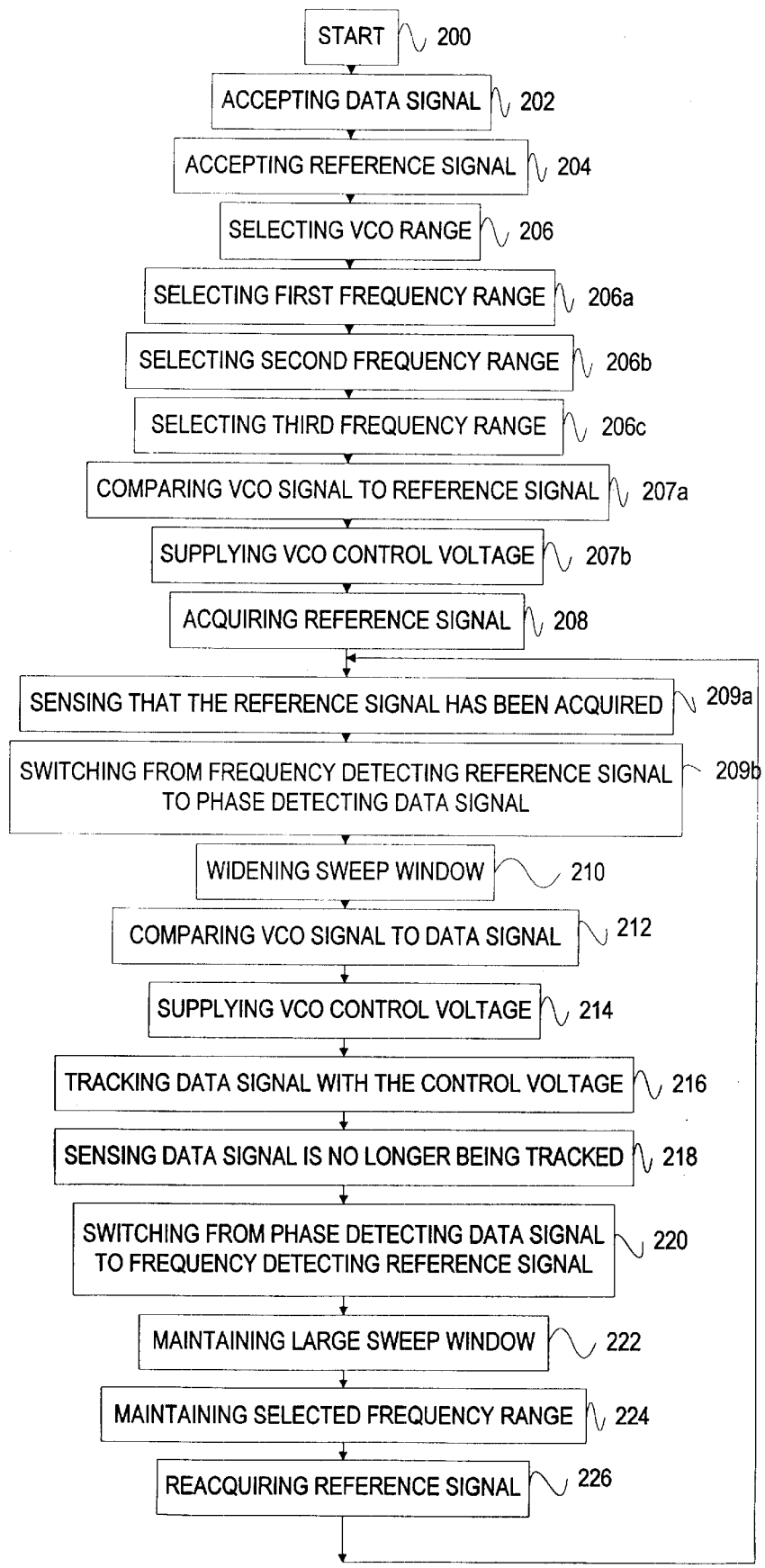
FIG. 3 is a flowchart depicting a method for acquiring and tracking a signal with a selectable frequency sweep window voltage controlled oscillator (VCO).

FIG. 3 is a flowchart depicting a method for acquiring and tracking a signal with a selectable frequency sweep window voltage controlled oscillator (VCO). Although the method is depicted as a sequence of numbered steps for clarity, no order should be inferred from the numbering unless explicitly stated. Step 200 is the start. Step 202 accepts a data signal having a first frequency. Step 204 accepts a reference signal having approximately the first frequency. Step 206 selects a VCO range from a plurality of frequency ranges. Step 208 acquires the reference signal in response to selecting the VCO frequency range. Step 210 widens the VCO frequency sweep window to track the data signal.

In some aspects of the invention, Step 207a compares the VCO signal to the reference signal to detect frequency differences. Step 207b, in response to frequency detecting, supplies a VCO control voltage. Acquiring the reference signal in response to selecting the VCO range in Step 208 includes acquiring the reference signal with the control voltage supplied in response to frequency detecting.

Step 212 compares the VCO signal to the data signal to detect phase differences. Step 214, in response to phase detecting, supplies a VCO control voltage. Step 216 tracks the data signal with the control voltage supplied in response to phase detecting.

Step 209a senses that the reference signal has been acquired. Step 209b switches from frequency detecting the reference signal to phase detecting the data signal, in response to sensing that the reference signal has been acquired.

Widening the VCO frequency sweep window to track the data signal in Step 210 includes widening the VCO frequency sweep window in response to sensing that the reference signal has been acquired.

In some aspects of the invention selecting a VCO range from a plurality of frequency ranges in Step 206 includes substeps. Step 206a selects a first frequency range for a first period of time. Step 206b selects a second frequency range when the input signal has not been acquired within the first period of time. Step 206c selects a third frequency range when the input signal has not been acquired within the first period of time.

Some aspects of the invention include a further step. Following the widening of the VCO frequency sweep window to track the data signal in Step 210, Step 218 senses that the data signal is no longer being tracked. Step 220 switches from phase detecting the data signal to frequency detecting the reference signal, in response to sensing that the data signal is no longer being tracked. Step 222 maintains the large VCO frequency sweep window in response to sensing that the data signal is no longer being tracked. Step 224 maintains the selected frequency range in response to sensing that the data signal is no longer being tracked.

Step 226 reacquires the reference signal. Step 209a senses that the reference signal has been acquired. Step 209b switches from frequency detecting the reference signal to phase detecting the data signal, in response to detecting that the reference signal has been acquired.

A system and method have been presented for acquiring and tracking a data signal using a selectable frequency range VCO. The invention uses a combination of discrete frequency ranges and variable sweep windows to minimize the VCO gain during acquisition. A specific example of the invention has been presented to clarify the invention. However, the invention is not limited to the specific example. Other variations and embodiments of the invention will occur to those skilled in the art.

We claim:

1. An auto-ranging phase-locked loop system for acquiring and tracking an input signal, the system comprising:
    a voltage controlled oscillator (VCO) having a first input to accept frequency range commands, a second input to accept sweep window commands, a third input to accept a control voltage, and an output to supply a VCO signal having a frequency responsive to the control voltage and a frequency range responsive to the frequency range and sweep window commands;
    a frequency detector having a first input connected to the VCO output to accept the VCO signal, a second input to accept a reference signal at a first frequency, and an output to supply a control voltage in response to comparing the frequencies of the input signals;
    a phase detector having a first input connected to the VCO output to accept the VCO signal, a second input to accept a data signal, at approximately the first frequency, and an output to supply a control voltage in response to comparing the frequencies of the input signals; and
    a multiplexor (MUX) having a first input connected to the output of the frequency detector, a second input connected to the output of the phase detector, a control input to accept a lock-detect signal, and an output to supply a selected input in response to the lock-detect signal.

2. The system of claim 1 further comprising:
    a lock-detect circuit having a first output to supply a lock-detect signal when the reference signal has been acquired; and
    wherein the MUX switches the MUX output from the frequency detector output to the phase detector output, in response to the lock-detect signal.

3. The system of claim 2 wherein the VCO accepts a sweep window command signal, to switch from a small sweep window to large sweep window, in response to the lock-detect signal.

4. The system of claim 3 further comprising:
    a clock having an output to supply a clock signal having a clock period;
    a range select circuit having a first input responsive to a clock signal and an output to provide a first frequency range command during a first clock period, a second frequency range command during a second clock period, and a third frequency range command during a third clock period; and
    wherein the VCO supplies a VCO signal in the first frequency range during the first clock period, in a second frequency range during the second clock period, and in a third frequency range during the third clock period.

5. The system of claim 4 further comprising:
    a first logic gate having a first input responsive to the lock-detect signal, and second input connected to the output of the clock circuit, and an output connected to the range select circuit; and
    wherein the range select circuit receives clock signals in response to the lock-detect signal.

6. The system of claim 5 further comprising:
    a reference source having an output connected to the second input of the frequency detector to supply the reference signal.

7. The system of claim 5 further comprising:
    a second logic gate having a first input connected to the lock-detect circuit output to accept the lock-detect signal, a second input, and an output;
    a latch having a data input connected to the output of the second logic gate, a first output to supply a latched detect signal, and a second output connected to the second input of the second logic gate to supply the complement of the latched detect signal; and a third logic gate having a first input connected to the output of the lock-detect circuit to accept the lock-detect signal, a second input connected to the first output of the latch to accept the latched detect signal, and an output connected to second input of the VCO and the first input of the first logic gate.

8. The system of claim 7 wherein the lock-detect circuit first output supplies an initial "high" lock-detect signal;

wherein the second logic gate supplies a "high" signal in response to the initial "high" lock-detect signal;

wherein the latch first output supplies a "high" latched detect signal in response to the initial "high" lock-detect signal;

wherein the third logic gate supplies a large sweep window command signal in response to the initial "high" lock-detect signal;

wherein the VCO switches to a large VCO sweep window in response to the large sweep window command signal; and wherein the first logic gate blocks the clock signal in response to the large sweep window command signal.

9. The system of claim 8 wherein the MUX selects the phase detector output in response to the initial "high" lock-detect signal.

10. The system of claim 9 wherein, following the initial "high" lock-detect signal, the lock-detect circuit supplies a "low" lock-detect signal;

wherein the second logic gate supplies a "low" signal in response to the "low" lock-detect signal;

wherein the latch first output supplies a "high" latched detect signal in response to the "low" lock-detect signal;

wherein the third logic gate supplies the large sweep window command signal in response to the "low" lock-detect signal;

wherein the VCO maintains the large VCO sweep window in response to the large sweep window command signal; and wherein the first logic gate continues to block the clock signal in response to the large sweep window command signal.

11. The system of claim 10 wherein the MUX selects the frequency detector output in response to the "low" lock-detect signal.

12. The system of claim 10 wherein following the "low" lock-detect signal, the lock-detect circuit first output supplies a second "high" lock-detect signal;

wherein the second logic gate supplies a "low" signal in response to the second "high" lock-detect signal;

wherein the latch first output supplies a "high" latched detect signal in response to the second lock-detect signal;

wherein the third logic gate supplies the large sweep window command signal in response to the second "high" lock-detect signal;

wherein the VCO maintains the large VCO sweep window in response to the large sweep window command signal; and wherein the first logic gate continues to block the clock signal in response to the large sweep window command signal.

13. The system of claim 12 wherein the MUX selects the phase detector output in response to the second "high" lock-detect signal.

14. The system of claim 7 wherein the lock-detect circuit has a second output to supply a "high" reset signal and a "low" signal on the first output when a decision has been made that the acquisition process must be reinitializied;

wherein the latch has a reset input connected to the second output to accept the reset signal, the latch initializing the latch first output to a "low" latch detect signal, in response to the "high" reset signal;

wherein the third logic gate supplies a small sweep window command signal in response to a "high" reset signal;

wherein the VCO sweep window is set to small in response to the small sweep window command signal;

wherein the first logic gate supplies the clock signal to the range circuit in response to the small sweep command signal; and wherein the MUX selects the frequency detector output in response to the "low" lock-detect signal.

15. The system of claim 1 further comprising:

a low pass filter having an input connected to the MUX output and an output connected to the third input of the VCO.

* * * * *